(12) United States Patent
Wang et al.

(10) Patent No.: US 11,616,166 B2
(45) Date of Patent: Mar. 28, 2023

(54) METHOD OF FORMING ELECTRONIC DEVICE

(71) Applicant: InnoLux Corporation, Miao-Li County (TW)

(72) Inventors: Hui-Chieh Wang, Miao-Li County (TW); Tsau-Hua Hsieh, Miao-Li County (TW); Jian-Jung Shih, Miao-Li County (TW); Fang-Ying Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 65 days.

(21) Appl. No.: 17/103,971

(22) Filed: Nov. 25, 2020

(65) Prior Publication Data

US 2021/0175390 A1 Jun. 10, 2021

(30) Foreign Application Priority Data

Dec. 9, 2019 (CN) .......................... 201911252195.8

(51) Int. Cl.
*H01L 33/00* (2010.01)
*H01L 33/62* (2010.01)
*H01L 25/075* (2006.01)

(52) U.S. Cl.
CPC ...... *H01L 33/0095* (2013.01); *H01L 33/0093* (2020.05); *H01L 33/62* (2013.01); *H01L 25/0753* (2013.01)

(58) Field of Classification Search
None
See application file for complete search history.

(56) References Cited

U.S. PATENT DOCUMENTS

| 8,333,860 B1 * | 12/2012 | Bibl ........................ | H01L 24/75 156/273.1 |
| 8,409,886 B2 * | 4/2013 | Iwafuchi ................. | H01L 24/82 257/89 |
| 2018/0138071 A1 | 5/2018 | Bower | |

* cited by examiner

*Primary Examiner* — Robert K Carpenter
(74) *Attorney, Agent, or Firm* — Winston Hsu

(57) ABSTRACT

A method of manufacturing an electronic device includes the steps of providing a conductive carrier with at least one electronic element disposed thereon, picking up the at least one electronic element, setting the conductive carrier to have a ground voltage at least in the step of picking up the at least one electronic element, and transferring the at least one electronic element to a target substrate.

20 Claims, 10 Drawing Sheets

METHOD OF FORMING ELECTRONIC DEVICE

BACKGROUND OF THE DISCLOSURE

1. Field of the Disclosure

The present disclosure relates to a method of forming an electronic device. More particularly, the present disclosure relates to a method of transferring a microelectronic element of an electronic device.

2. Description of the Prior Art

As the technique and technology continue toward progress and development, electronic devices have become necessary in daily life. For example, electronic devices such as display devices or touch display devices are noted for the features of light weight, thin thickness, low power consumption and low radiation pollution, and have been widely used in various portable or wearable electronic products such as notebooks, smart phones, watches and car displays to fulfill the needs of transmitting information and displaying pictures in a more convenient way.

Electronic elements such as micro LEDs or mini LEDs have drawn great attention recently and are regarded to open a new generation of display technology. The micro LED technology or the mini LED technology involve miniaturizing the structures of conventional LED elements and arranging the miniaturized LED elements into an array for being able to address and individually drive and control each of the pixels (each of the LED elements). How to efficiently and accurately transfer the miniaturized LED elements to the target substrate is an important research topic in the field.

SUMMARY OF THE DISCLOSURE

One aspect of the present disclosure is to provide a method of forming an electronic device which may increase the efficiency and accuracy of transferring the electronic elements to the target substrate.

In one embodiment of the present disclosure, a method of manufacturing an electronic device is disclosed and includes the steps of providing a conductive carrier with at least one electronic element disposed thereon, picking up the at least one electronic element, setting the conductive carrier to have a ground voltage at least in the step of picking up the at least one electronic element, and transferring the at least one electronic element to a target substrate.

In one embodiment of the present disclosure, a method of manufacturing an electronic device is disclosed and includes the steps of providing a conductive carrier with at least one electronic element disposed thereon, picking up the at least one electronic element, setting the conductive carrier to have a reference voltage at least in the step of picking up the at least one electronic element, and transferring the at least one electronic element to a target substrate.

The method of forming an electronic device provided by the present disclosure is featured in that the sacrificial layer is removed after forming the insulating layer on the electronic elements to hold the electronic elements on the conductive carrier. In this way, the risk of failing to pick up the electronic elements due to the adhesive force of the sacrificial layer greater than the electrostatic force of attraction between the transfer heads and the electronic elements may be reduced. Furthermore, by controlling the charges of electronic elements by the conductive structures of the conductive carrier, the transferring efficiency and accuracy may be improved.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. The drawings in this disclosure are not drawn to scale unless being specifically specified. For clarity of presentation, the drawings are simplified and some details or elements are omitted.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". It will be understood that when a component is referred to as being "connected to" another component (or its variant), it may be directly connected to the "another component", or connected to the "another component" through one or more intervening components.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

Although the terms such as "first", "second" and "third" may be used in the description and following claims to describe various components in claims, these terms does not mean or represent the claimed components have order and does not represent the order of one claimed component and another one claimed component, or the sequence in manufacturing method. Furthermore, the claims are allowed to use different denominations for the components and may use terms such as "first", "second" and "third" according to the order of the components described in the claims. According to the above, for example, the first component in the description may be denominated as the second component in the claims.

Figure 1:
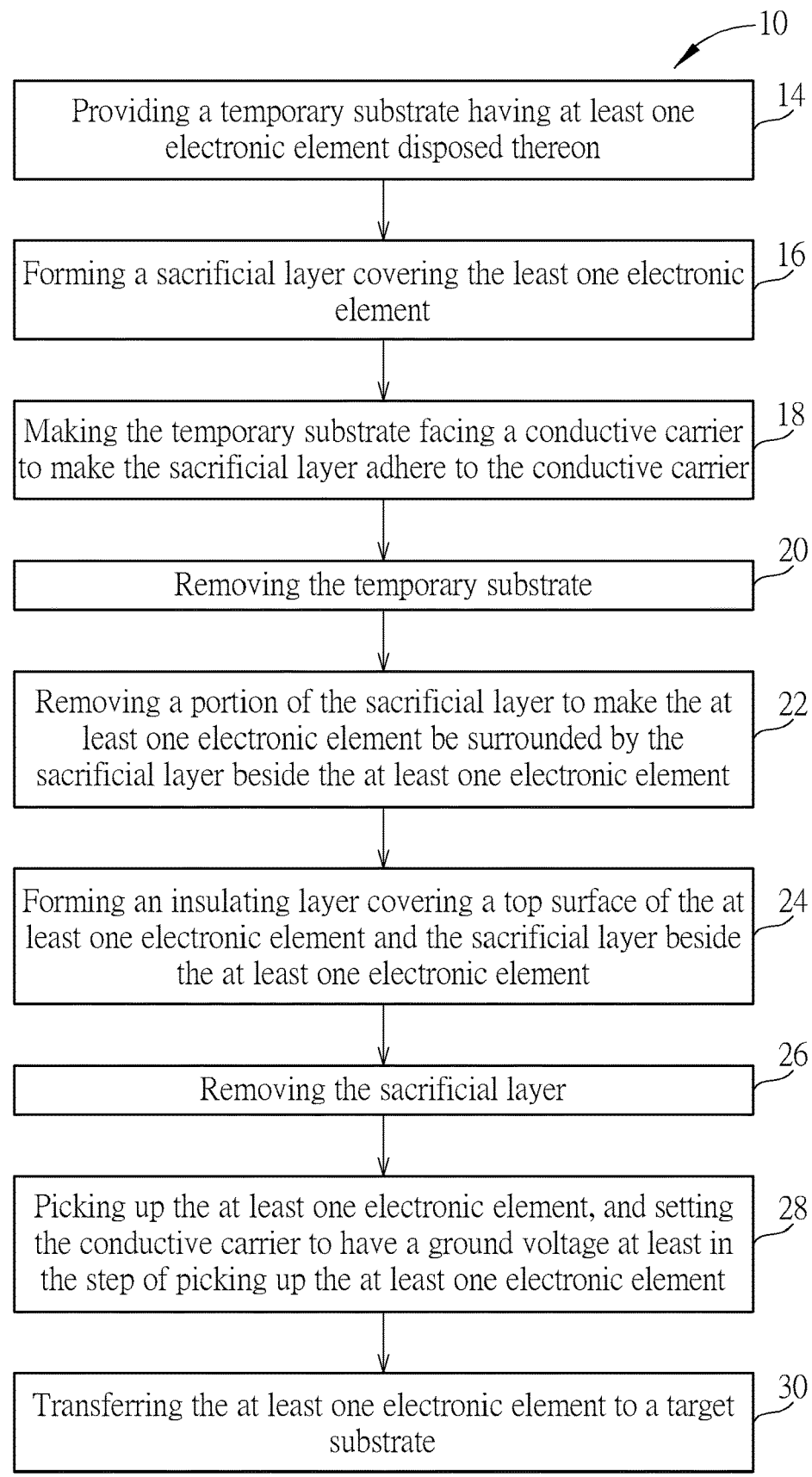
FIG. 1 is a flow chart illustrating the method of forming an electronic device according to an embodiment of the disclosure.
Figure 4:
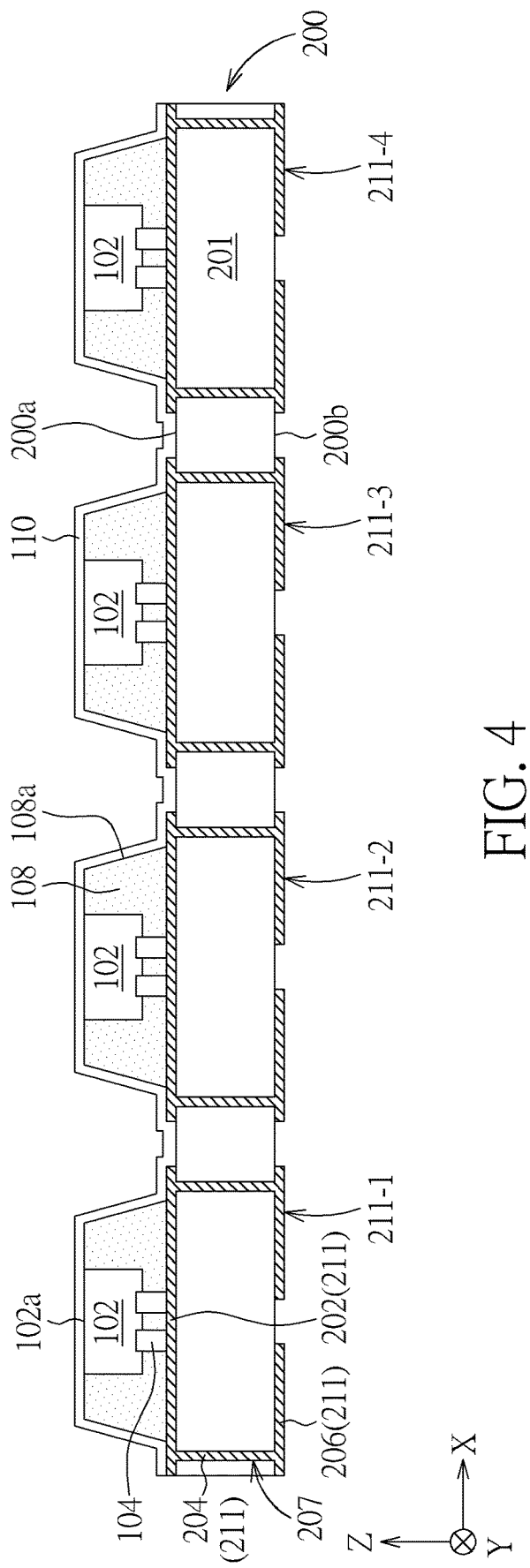
Figure 5:
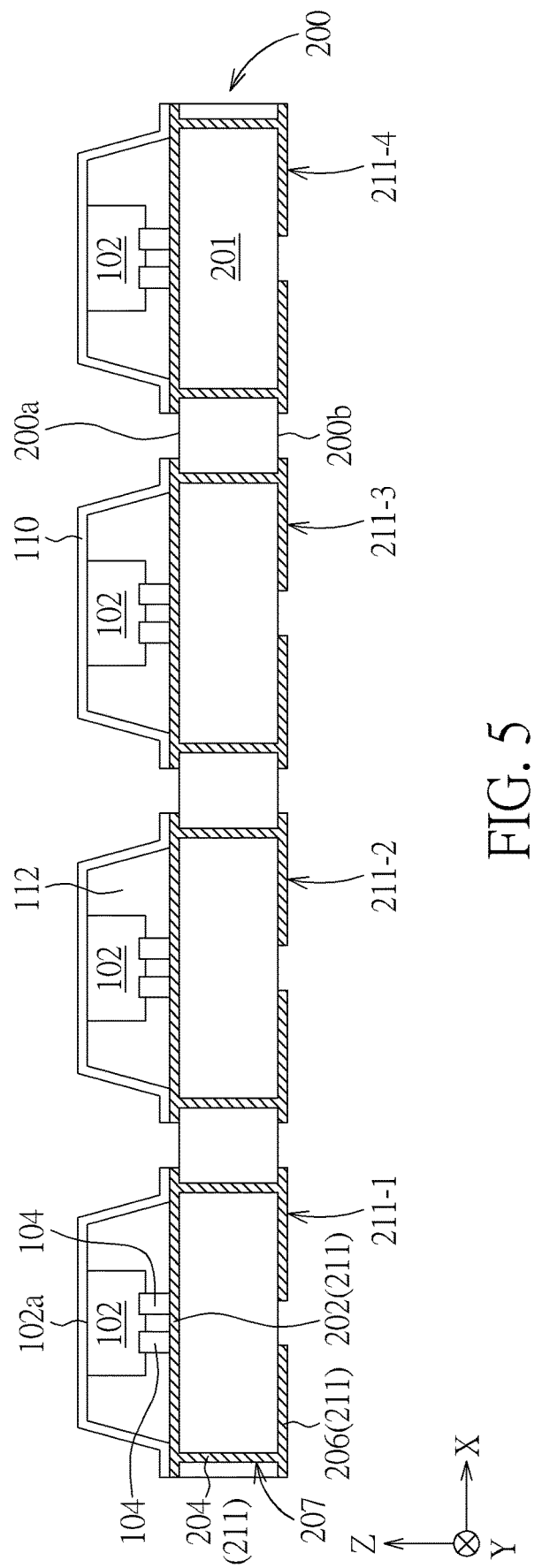
Figure 6:
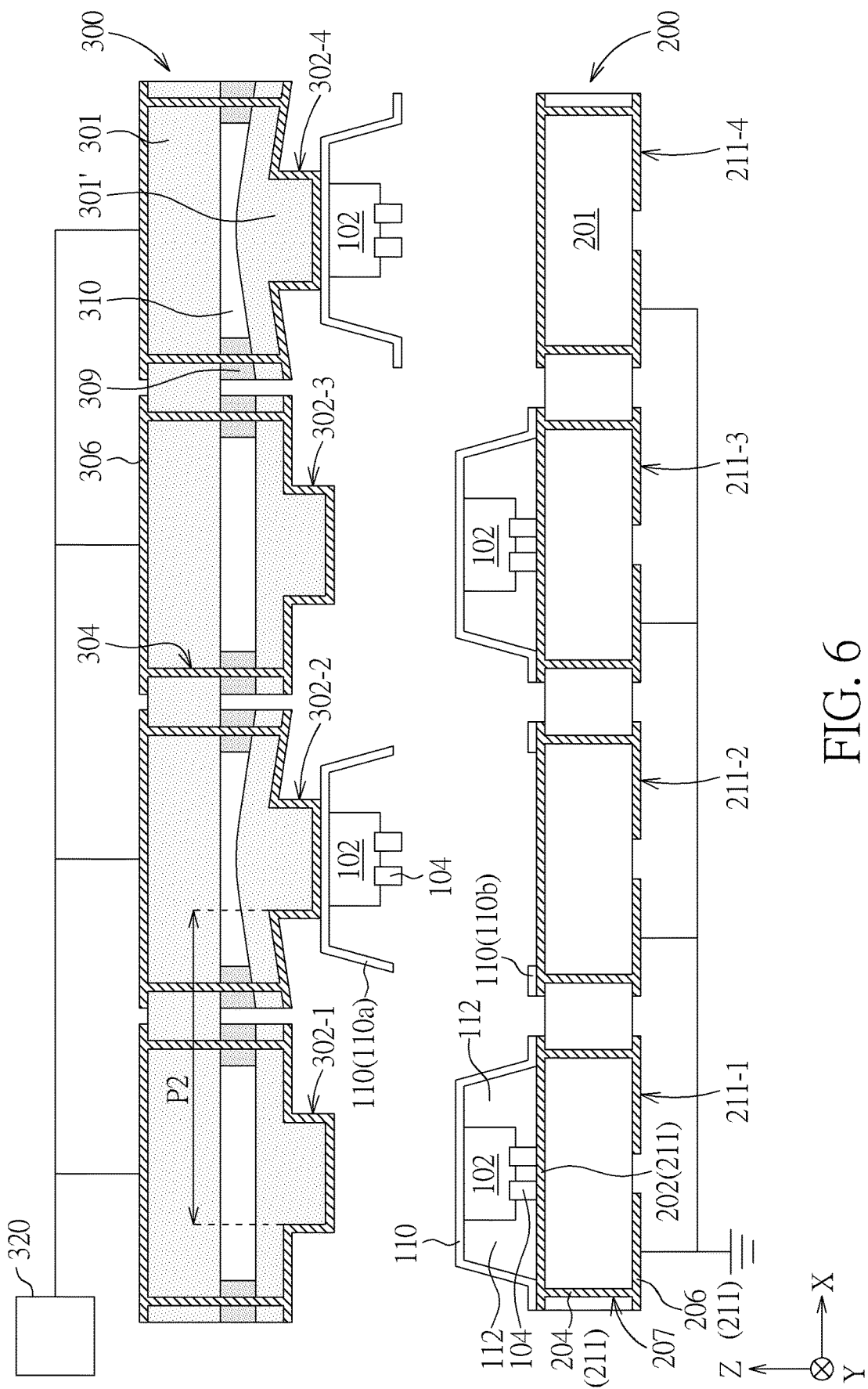
FIG. 6 is a schematic cross-sectional view illustrating the step of picking up the electronic elements from a conductive carrier according to an embodiment of the disclosure.
Figure 7:
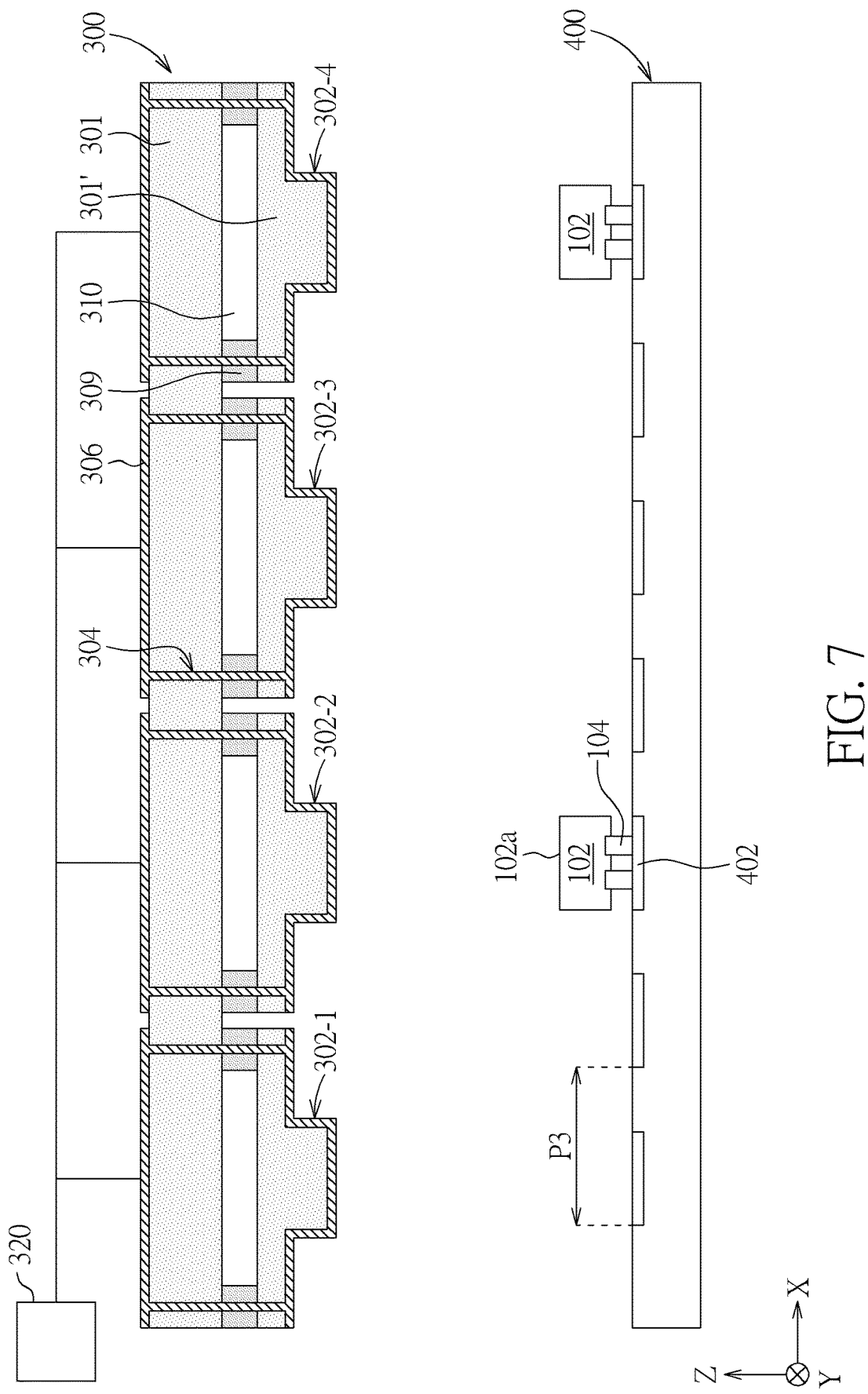
FIG. 7 is a schematic cross-sectional view illustrating the step of transferring the electronic elements to a target substrate according to an embodiment of the disclosure.

Please refer to FIG. 1 and FIG. 2 to FIG. 7. FIG. 1 is a flow chart illustrating the method 10 of forming an electronic device according to an embodiment of the disclosure. FIG. 2 to FIG. 5 are schematic cross-sectional views illustrating the processes of step 14 to step 26 shown in FIG. 1, which show the process of transferring at least one electronic element from a first substrate (such as a temporary substrate) to a second substrate (such as a conductive carrier) in order to provide the second substrate (such as the conductive carrier) with the at least one electronic element disposed thereon. FIG. 6 is a cross-sectional diagram corresponding to the step 28 of the method 10 shown in FIG. 1, illustrating the step of picking up the at least one electronic element from the second substrate (such as the conductive carrier). FIG. 7 is a cross-sectional diagram corresponding to the step 30 of the method 10 shown in FIG. 1, illustrating the step of transferring the at least one electronic element to a third substrate (such as a target substrate). It should be understood that the method of forming the electronic device provided by the present disclosure is not limited to the steps of the method 10 shown in FIG. 1. In some embodiments, additional steps may be performed before, after, or between the steps of the method 10. Furthermore, some steps of method 10 may be performed at the same time or in a different order from that shown in FIG. 1.

Figure 2:
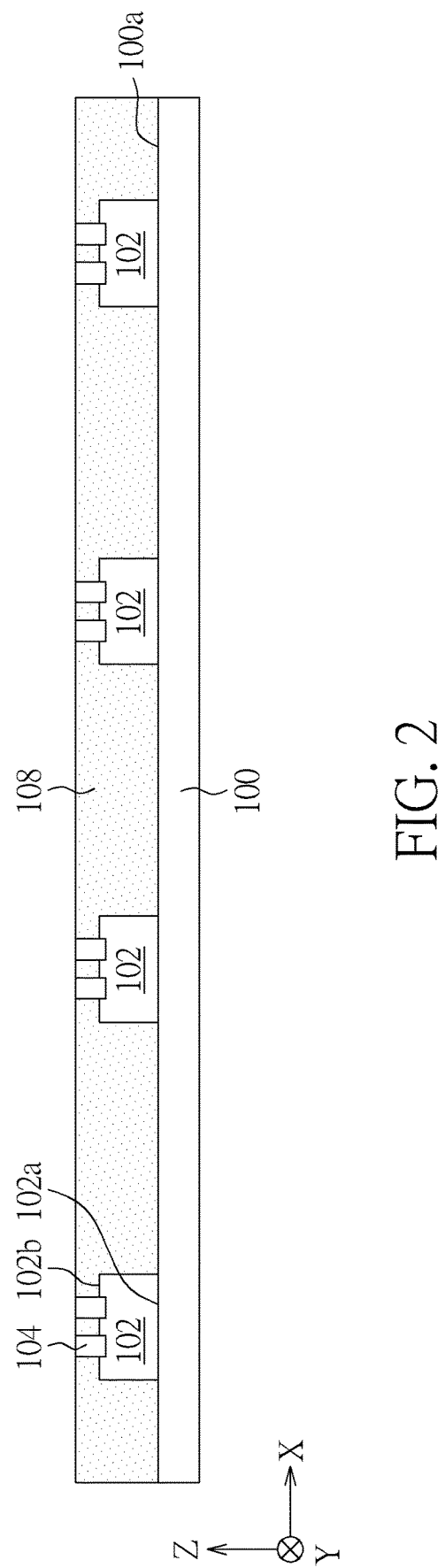
FIG. 2 to FIG. 5 are schematic cross-sectional views illustrating the steps of transferring the electronic elements from a temporary substrate to a conductive carrier according to an embodiment of the disclosure.

Please refer to FIG. 1 and FIG. 2. The method of forming an electronic device provided by the present disclosure includes the step of providing a substrate having at least an electronic element disposed thereon. According to an embodiment, the process of providing the substrate may include performing the step 14, which includes providing a temporary substrate 100 having at least one or a plurality of electronic elements 102 disposed on a surface 100a of the temporary substrate 100. Next, step 16 is performed, which includes disposing a sacrificial layer 108 on the temporary substrate 100 and covering the least one or a plurality of electronic elements 102. In the embodiment as shown in FIG. 2, a plurality of electronic elements 102 may be disposed on the temporary substrate 100. The electronic elements 102 may be arranged into an equally spaced or unequally spaced array. The sacrificial layer 108 covers the electronic elements 102, and/or covers the spaces between the neighboring electronic elements 102.

The temporary substrate 100 may be, for example, an epitaxial semiconductor substrate on which the electronic elements 102 are fabricated. In some embodiments, the temporary substrate 100 may be a silicon substrate, a group III-V substrate, a sapphire substrate, or other suitable substrates, but is not limited thereto. The electronic elements 102 may be semiconductor elements, such as light emitting diodes (LEDs). For example, the electronic elements 102 may be micro LEDs, sub-millimeter light-emitting diodes (mini LEDs), quantum light-emitting diodes (quantum LEDs), nanowire light-emitting diodes (nanowire LEDs), bar-type LEDs, organic light emitting diodes (OLEDs), quantum-dot light emitting diodes (QD-LEDs), or a combination thereof, but is not limited thereto. As shown in FIG. 2, the electronic elements 102 may respectively have a top surface 102a and a bottom surface 102b that are opposite to each other. The electronic elements 102 are arranged in a manner that the top surface 102a faces and is near the surface 100a of the temporary substrate 100, and the bottom surface 102b faces away from the surface 100a of the temporary substrate 100. The bottom surface 102b of each of the electronic elements 102 has electrodes 104 for electrically connecting to the outer circuits.

The sacrificial layer 108 may be used to hold the electronic elements 102 on the temporary substrate 100. The material of the sacrificial layer 108 may be, for example, a patternable photoresist or an adhesive material, or other suitable materials. In this embodiment, after the sacrificial layer 108 is coated on the temporary substrate 100 and cured, an etching back process may be performed to remove a portion of the sacrificial layer 108 until the electrodes 104 of the electronic elements 102 are exposed, but it is not limited thereto.

Figure 3:
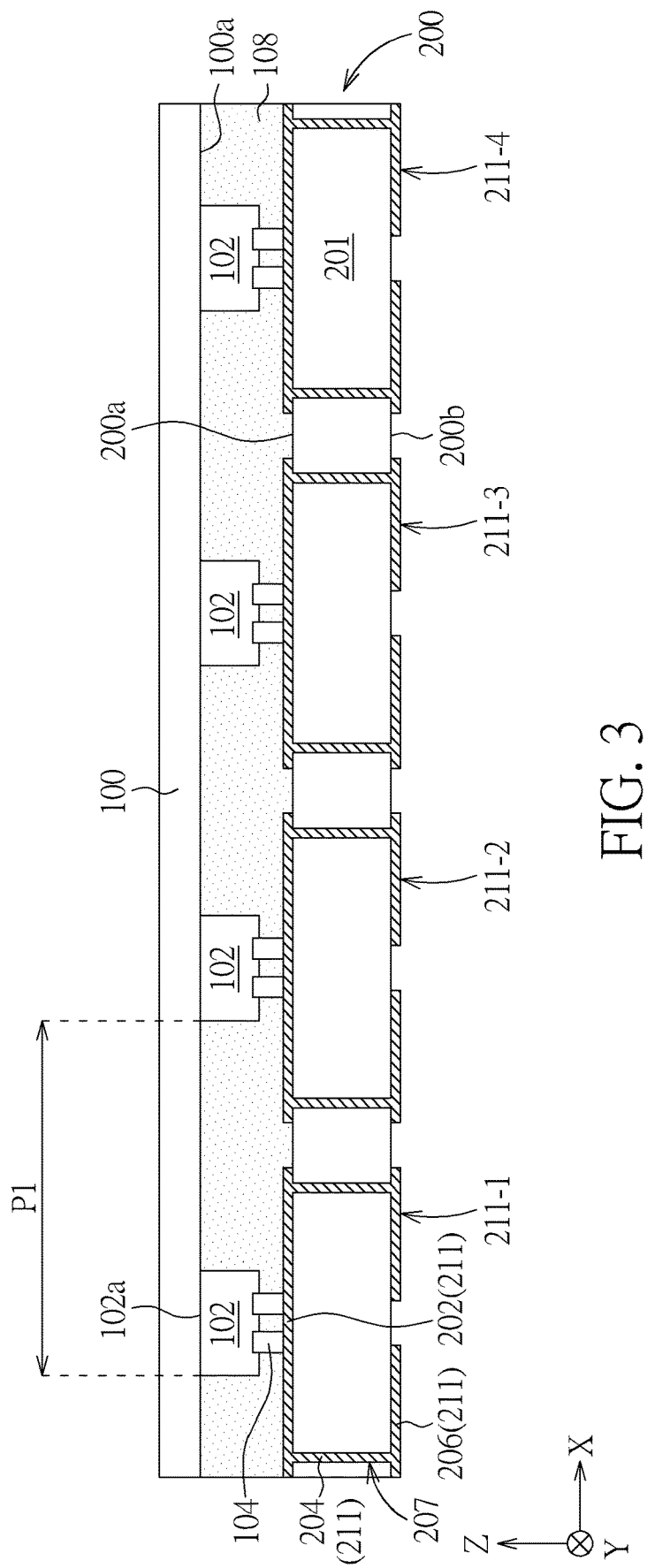

Please refer to FIG. 1 and FIG. 3. Subsequently, the step 18 is performed, which includes making the temporary substrate 100 oriented in a manner that the surface 100a of the temporary substrate 100 faces and is close to the upper surface 200a of the conductive carrier 200 in the vertical direction (for example, the Z direction) to make the sacrificial layer 108 contact the conductive carrier 200 and adhere to the conductive carrier 200. In some embodiments, the sacrificial layer 108 may be adhered to the conductive carrier 200 by performing a thermo-compression bonding process. In some embodiments, an adhesive layer may be provided to bond the sacrificial layer 108 and the conductive carrier 200, but is not limited thereto.

The base layer 201 of the conductive carrier 200 may include a semiconductor material layer, such as a silicon layer, a silicon-on insulator (SOI) layer or other suitable semiconductor material layers, but is not limited thereto. The conductive carrier 200 may include a single-layered structure or multi-layered structure, and may include conductive structures formed therein. The conductive structures of the conductive carrier 200 may be formed by semiconductor processes such as thin film deposition processes, patterning processes, etching processes and implantation processes, but is not limited thereto. In some embodiments, the conductive carrier 200 may include other structures formed therein or on the surface thereof, such as transistors, metallized structures, integrated circuits, passivation layers, encapsulation layers, insulating layers, but are not limited thereto.

The conductive carrier 200 may include at least one conductive structure 211. The conductive structure 211 may include a plurality of conductive pads 202 arranged on the upper surface 200a of the conductive carrier 200, conductive circuits 206 arranged on the lower surface 200b of the conductive carrier 200, and connecting portions 204 to electrically connect the conductive pads 202 and the conductive circuits 206. The connecting portions 204 may be formed in the vias 207 through the conductive carrier 200. The conductive pad 202, the conductive circuit 206 that is electrically connected conductive pad 202 and the connecting portion 204 for connecting the conductive pad 202 and the conductive circuit 206 may be regarded as a sub-conductive structure. For example, the conductive structure 211 shown in FIG. 3 has the sub-conductive structure 211-1, the sub-conductive structure 211-2, the sub-conductive structure 211-3, and the sub-conductive structure 211-4. In some embodiments, each of the sub-conductive structures may be an independent circuit, respectively. In other embodiments, the sub-conductive structures may be electrically connected to each other to form a combinational circuit. Furthermore, the sub-conductive structures of a same combinational circuit may be consecutively arranged and are adjacent to each other, or may be arranged at intervals. The arrangements of the sub-conductive structures are not limited to the above examples. The material of the conductive structure 211 may include metal materials or other suitable conductive materials, such as copper (Cu), aluminum (Al), tungsten (W), titanium (Ti), platinum (Pt), nickel (Ni) and other metal materials or metal alloy, but not limited thereto.

In some embodiments, the step 18 may include electrically connecting the electronic elements 102 to the conductive carrier 200. For example, the electronic elements 102 may be electrically connected to the conductive carrier 200 by arranging the electrodes 104 of each of the electronic elements 102 on the corresponding conductive pads 202 of the conductive structure 211 and then electrically connecting the electrodes 104 and the corresponding conductive pads 202. According to an embodiment of the present disclosure, a thermo-compression bonding process may be performed to form metal-metal bonds between the electrodes 104 and the corresponding conductive pads 202 thereby mounting the electronic elements 102 on the conductive carrier 200. In other embodiments, a conductive adhesive such as a solder paste or an anisotropic conductive film (ACF) (not shown) may be used to bond the electrodes 104 and the conductive pads 202, but is not limited thereto.

It should be noted that the structures and arrangements of the conductive pads 202, the conductive circuits 206 and the connecting portions 204 shown in the diagrams are examples for the convenience of drawing and description, and should not be taken as a limitation of the present disclosure. The configurations of the conductive pads 202, the conductive circuits 206 and the connecting portions 204 may be designed according to application requirements. In some embodiments, the patterns of the conductive pads 202 may be adjusted according to design needs to match the positions of the electrodes 104 of the electronic elements 102. For example, in the embodiment shown in FIG. 2, the electrodes 104 of each of the electronic elements 102 are arranged on a same conductive pad 202 of the conductive structure 211. In other embodiments (such as the embodiments shown in FIG. 8 and FIG. 10), the conductive pads 202 for bonding an electronic element 102 may be patterned into multiple sections, and the electrodes 104 of the electronic element 102 may be respectively disposed on one of the sections of the conductive pad 202.

Please refer to FIG. 1 and FIG. 4. Subsequently, the step 20 is performed, which includes removing the temporary substrate 100 and exposing the top surface 102a of the electronic elements 102. Next, the step 22 is performed, which includes removing a portion of the sacrificial layer 108 to make each of the electronic elements 102 be surrounded by another portion of the sacrificial layer 108. For example, each of the electronic elements 102 be surrounded by a remaining portion of the sacrificial layer 108 beside the electronic elements 102. As shown in FIG. 4, the portions of the conductive carrier 200 between the electronic elements 102 may be exposed from the remaining portion of the sacrificial layer 108 beside the electronic elements 102. The process of removing a portion of the sacrificial layer 108 may include, for example, performing a patterning process on the sacrificial layer 108 to remove a portion of the sacrificial layer 108 without removing the portion of the sacrificial layer 108 that closely surrounds the vicinities of each of the electronic elements 102. The patterning process may be a photolithography-etching process, but not limited thereto. As shown in FIG. 4, the electronic elements 102 are respectively surrounded by the remaining portion of the sacrificial layer 108 beside the electronic elements 102 (for example, in the plane along the X direction and the Y direction, the electronic elements 102 are the centers and are surrounded by parts of the remaining portion of the sacrificial layer 108 that are closest to the electronic elements 102. As shown in FIG. 4, the sidewalls 108a of the remaining portion of the sacrificial layer 108 beside the electronic elements 102 and the upper surface 200a of the conductive carrier 200 may have an angle. The sidewalls 108a of the remaining portion of the sacrificial layer 108 beside the electronic elements 102 may be inclined planes. In some embodiments, the sidewalls 108a of the remaining portion of the sacrificial layer 108 may be perpendicular to the upper surface 200a of the conductive carrier 200, or may be curved planes, but are not limited thereto. After patterning the sacrificial layer 108, portions of the conductive pads 202 may be exposed and may contact the insulating layer 110 formed in later processes. In other embodiments, after patterning the sacrificial layer 108, the conductive pads 202 may be completely covered by the remaining portion of the sacrificial layer 108 and are not exposed.

Please continue to refer to FIG. 1 and FIG. 4. After patterning the sacrificial layer 108, the step 24 is performed, which includes forming an insulating layer 110 on the conductive carrier 200 and covering the top surfaces 102a of the electronic elements 102 and the remaining portion of the sacrificial layer 108 beside the electronic elements 102. The insulating layer 110 may cover and/or may directly contact the top surfaces 102a of the electronic elements 102, the remaining portion of the sacrificial layer 108 beside the electronic elements 102 and the exposed portions of the upper surface 200a of the conductive carrier 200. The insulating layer 110 may be made of a dielectric material. The dielectric material of the insulating layer 110 may include silicon oxide, silicon nitride, silicon oxynitride, silicon carbide, silicon carbonitride, or a high-k dielectric material, but is not limited thereto. The insulating layer 110 may be formed by a chemical vapor deposition (CVD) process, a physical vapor deposition (PVD) process, or an atomic layer deposition (ALD) process, but is not limited thereto.

Please refer to FIG. 1 and FIG. 5. Subsequently, the step 26 is performed, which includes removing the sacrificial layer 108 thereby forming spaces 112 between the insulating layer 110 and the conductive carrier 200. The electronic elements 102 are respectively disposed in one of the spaces 112. The process of removing the sacrificial layer 108 in step 26 may include, for example, patterning the insulating layer 110 by an etching process or other suitable processes to form at least an opening (not shown) in the insulating layer 110, and then performing a wet etching process or other suitable processes to remove the sacrificial layer 108 from the opening. After removing the sacrificial layer 108, the electronic elements 102 may be held on the conductive carrier 200 by the insulating layer 110 on the top surfaces 102a of the electronic elements 102. In some embodiments, the insulating layer 110 between the electronic elements 102 may not be removed when patterning the insulating layer 110.

Please refer to FIG. 1 and FIG. 6. Subsequently, the step 28 is performed, which includes picking up at least one or a plurality of the electronic element 102 from the conductive carrier 200, and at least during the step of picking up the electronic element 102, setting the conductive carrier 200 to have a voltage (such as a reference voltage). As shown in FIG. 6, a transfer device 300 may be used to pick up the electronic elements 102. The transfer device 300 may include a plurality of conductive transfer heads, such as the transfer head 302-1, the transfer head 302-2, the transfer head 302-3 and the transfer head 302-4, and may optionally include the conductive circuits 306 and the connection circuits 304 located in the through holes to selectively supply voltages to the transfer heads 302-1, 302-2, 302-3 and 302-4. At least a control circuit 320 may be electrically connected to the transfer device 300 to control the voltages supplied to the transfer heads 302-1, 302-2, 302-3 and 302-4. For example, as shown in FIG. 6, when picking up the electronic elements 102, the control circuit 320 may concurrently supply a pull-in voltage to the transfer head 302-2 and the transfer head 302-4 which are used to pick up the selected electronic elements 102. The pull-in voltage may generate an electrostatic force such like electrostatic force of attraction between the transfer heads 302-2, 302-4 and the corresponding electronic elements 102 for picking up the electronic elements 102. In this way, by selecting the transfer heads to supply with the pull-in voltage, a selective picking of the electronic elements 102 may be achieved. In some embodiments, the conductive circuits 306 of the transfer heads 302-1, 302-2, 302-3 and 302-4 may respectively be an independent circuit. In some embodiments, the conductive circuits 306 of the transfer heads 302-1, 302-2, 302-3 and 302-4 may be designed to be electrically connected to each other to form a set of electrically connected transfer heads. Furthermore, in a same set of transfer heads, the transfer heads may be consecutively arranged and are adjacent to each other, or may be arranged at intervals. The present disclosure is not limited to the above designs.

According to some embodiments of the present disclosure, the transfer device 300 may include a mechanical design having elastic property. For example, the transfer device 300 may include two base layers, the base layer 301 and the base layer 301', and an intermediate insulating layer 309 disposed between the base layers 301 and the base layer 301'. There may be a gap 310 formed between the base layer 301, the base layer 301' and the intermediate insulating layer 309. The gap 310 may be formed by removing a portion of the intermediate insulating layer 309, but is not limited thereto. The materials of the base layers 301, the base layer 301' and the intermediate insulating layer 309 may include semiconductor materials such as silicon or silicon oxide, but are not limited thereto. In some embodiments, the base layer 301' may be made of an elastic material. The thickness of the base layer 301' may be adjusted to impart an elastic property to the transfer device 300, but it is not limited thereto. In some embodiments, the base layers 301 and the base layer 301' may include silicon. The mechanical design of the transfer device 300 may allow the transfer heads 302-1, 302-2, 302-3 and 302-4 to have appropriate elastic displacements in the vertical direction for compensating the warpage of the conductive carrier 200 and/or the transfer device 300, and/or compensates the topography caused by the thickness variations of the electronic elements 102. In this way, the transfer heads 302-1, 302-2, 302-3 and 302-4 may contact the insulating layer 110 more intimately and the accuracy of the transfer heads 302-1, 302-2, 302-3 and 302-4 to pick up the selected electronic elements 102 may be improved.

The "reference voltage" supplied to the conductive carrier 200 may be an AC voltage or a DC voltage, and is used to make the conductive carrier 200 have a standard potential or a reference potential of the circuit. In other words, the conductive carrier 200 may be connected to an unlimited charge supplying source or an unlimited charge absorption tank that may provide charges or absorb charges without a limitation. In this embodiment, the reference voltage may be smaller than the pull-in voltage, so that the electrical potential of the conductive carrier 200 may be smaller than the electrical potential of the transfer device 300. In some embodiments, the AC voltage may be, for example, a ground voltage, and the range of the ground voltage may be 10E-12 to 10E-5 volts (V), 10E-6 to 10E-5 volts (V), or 10E-12 to 10E-6 volts (V), but is not limited thereto. In some embodiments, for example, the DC voltage may be approximately 0 volts. The reference voltage may be adjusted according to practical needs.

In more detail, the process of step 28 includes placing the transfer heads 302-1, 302-2, 302-3 and 302-4 above the corresponding electronic elements 102, and then moving the transfer device 300 (and/or moving the conductive carrier 200 relatively) so that the transfer heads 302-1, 302-2, 302-3 and 302-4 of the transfer device 300 are close to and/or directly contact the insulating layer 110 on the conductive carrier 200. It is noteworthy that at least during the above process, the control circuit 320 may supply a pull-in voltage to the transfer head 302-2 and transfer head 302-4 that are selected to pick-up the selected electronic elements 102, and at the same time, the conductive carrier 200 is set to have a reference voltage (for example, a ground voltage). In this way, the electric field generated by the pull-in voltage may polarize the insulating layer 110. The induced charges opposite to the pull-in voltage may accumulate on the top surface 102a of the electronic elements 102, and the induced charges in the conductive carrier 200 and/or in the electronic elements 102 may be purged (through the conductive structure 211) to the ground. When the pull in voltage is a positive voltage, negative induced charges will accumulate on the top surface 102a of the electronic element 102. When the pull-in voltage is negative, positive induced charges will accumulate on the top surface 102a of the electronic element 102. By the mechanism described above, an electrostatic force of attraction may be generated between the transfer heads 302-2, 302-4 and the corresponding electronic elements 102 so that the selected electronic elements 102 may adsorb to the transfer heads 302-2, 302-4. When the transfer device 300 is relatively moved away from the conductive carrier 200, the electronic elements 102 adsorbing on the transfer heads 302-2, 302-4 may be simultaneously separated from the conductive carrier 200. In some embodiments, optionally, the conductive carrier 200 may be heated or the electronic elements 102 may be heated via the transfer heads 302 during the picking up process to facilitate separating the electrodes 104 of the electronic elements 102 from the conductive pads 202 of the conductive carrier 200.

In some embodiments, during the step 28, the timing when the control circuit 320 provides the pull-in voltage to the selected transfer heads 302-2, 302-4 to pick up the electronic elements 102 may be prior to the time that the transfer heads 302-1, 302-2, 302-3 and 302-4 contact the insulating layer 110. In other embodiments, the timing when the control circuit 320 provides the pull-in voltage to the selected transfer heads 302-2, 302-4 to pick up the electronic elements 102 may be later than the time that the transfer heads 302-1, 302-2, 302-3 and 302-4 contact the insulating layer 110. In still other embodiments, the timing when the control circuit 320 provides the pull-in voltage to the selected transfer heads 302-2, 302-4 to pick up the electronic elements 102 may be at the same time as the time that the transfer heads 302-1, 302-2, 302-3 and 302-4 contact the insulating layer 110, but is not limited thereto. In some embodiments, the operation of setting the conductive carrier 200 to have the reference voltage may be performed at the same time or prior to the time that the control circuit 320 supplies the pull-in voltage to the transfer heads 302-2, 302-4. In some embodiments, the operation of setting the conductive carrier 200 to have the reference voltage may be performed at least at the time when the transfer heads 302-2 and 302-4 are picking up the electronic elements 102.

In the embodiment shown in FIG. 6, when the electronic elements 102 are separated from the conductive carrier 200, a portion of the insulating layer 110 for holding the electronic elements 102 may be pulled apart. A portion of the insulating layer 110b may be left on the conductive carrier 200, and another portion of the insulating layer 110(110a) may be moved with the picked electronic elements 102. The thickness of the insulating layer 110 may be adjusted according to practical needs. For example, the thickness of the insulating layer 110 may range from a few angstroms (Å) to approximately 100 nanometers (nm), but is not limited thereto. It should be noted that the portion of the insulating layer 110 being broken is not limited to the part near the conductive carrier 200 as shown in FIG. 6. The insulating layer 110 may be broken at any portion of the insulating layer 110. In addition, the insulating layer 110 on different electronic elements 102 may break at different portions. In some embodiments, the insulating layer 110 on a picked electronic element 102 may not be broken and may be peeled off from the conductive carrier 200 with the electronic element 102.

Please refer to FIG. 1 and FIG. 7. Subsequently, the step 30 is performed, which includes transferring the electronic elements 102 to a target substrate 400. In some embodiments, the electrodes 104 of the electronic elements 102 may be placed on and bonded to a corresponding bonding pad 402 of the target substrate 400. The material of the bonding pad 402 may include metals or other suitable conductive materials. The bonding pad 402 may include a metal such as copper (Cu), aluminum (Al), tungsten (W), titanium (Ti), platinum (Pt), nickel (Ni) or other metal materials or metal alloy, but is not limited thereto. After transferring the electronic elements 102, optionally, the insulating layer 110 may be removed.

The target substrate 400 may be any suitable substrate having a control circuit or a drive circuit formed thereon. In some embodiments, the target substrate 400 may be a flexible circuit board (FPC) or a printed circuit board (PCB), but is not limited thereto. In some embodiments, the target substrate 400 may include thin film transistors (TFTs), such as top-gate TFTs, bottom-gate TFTs, double-gate TFTs, or a combination thereof, but is not limited thereto. The target substrate 400 may be used to form an electronic device. The electronic device may be a display device having display medias such as liquid crystals (LCs), organic light-emitting diodes (OLEDs), quantum dots, fluorescent materials, phosphor materials, light-emitting diodes (LEDs), sub-millimeter light-emitting diodes (mini LEDs) or micro light-emitting diodes (micro LEDs), but is not limited thereto. To simplify the drawing, only bonding pads 402 of the target substrate 400 for bonding the electronic elements 102 are shown in FIG. 7.

In some embodiments, a thermo-compression bonding process may be used to bond the electronic element 102 to the target substrate 400 by forming a metal-metal bond between the electrodes 104 of the electronic elements 102 and the corresponding bonding pads 402. In some embodiments, a conductive adhesive such as a solder paste or an anisotropic conductive film (ACF) (not shown) may be used to bond the electrodes 104 and the conductive pads 202, but it is not limited thereto.

It should be noted that, the pitch P1 of the electronic elements 102 arranged on the conductive carrier 200 (as shown in FIG. 3), the pitch P2 of the transfer heads 302-1, 302-2, 302-3 and 302-4 of the transfer device 300 (FIG. 6), the pitch P3 of the bonding pad 402 of the target substrate 400 (FIG. 7), the numbers of electronic elements 102 being picked in each batch, the numbers of the intervals between the picked electronic elements 102, and the positions of the electronic elements 102 being bonded on the target substrate 400 shown in FIG. 2 to FIG. 7 are for the purpose of facilitating explanation and drawing, and are not a limitation of the present disclosure. For example, the pitch P2 of the transfer heads 302-1, 302-2, 302-3 and 302-4 may be equal to the pitch P1 of the electronic elements 102. In other embodiments, the pitch P2 of the transfer heads 302-1, 302-2, 302-3 and 302-4 may be larger than the pitch P1 of the electronic elements 102 and may be an integer multiple of the pitch P1 of the electronic elements 102. In some embodiments, the pitch P3 of the bonding pads 402 and the pitch P1 of the electronic elements 102 on the conductive carrier 200 may be unequal. In some embodiments, the pitch P3 of the bonding pads 402 may be greater than, less than or equal to the pitch P2 of the transfer heads 302-1, 302-2, 302-3 and 302-4. It should be noted that the term "pitch" in the above disclosure refers to a distance between the same sides of the neighboring components.

The following description will detail the different embodiments of the present disclosure. For making it easier to understand the differences between the embodiments, the following description will detail the dissimilarities among different embodiments and the identical features will not be redundantly described. To simplify the description, identical components in each of the following embodiments are marked with identical symbols.

Figure 8:
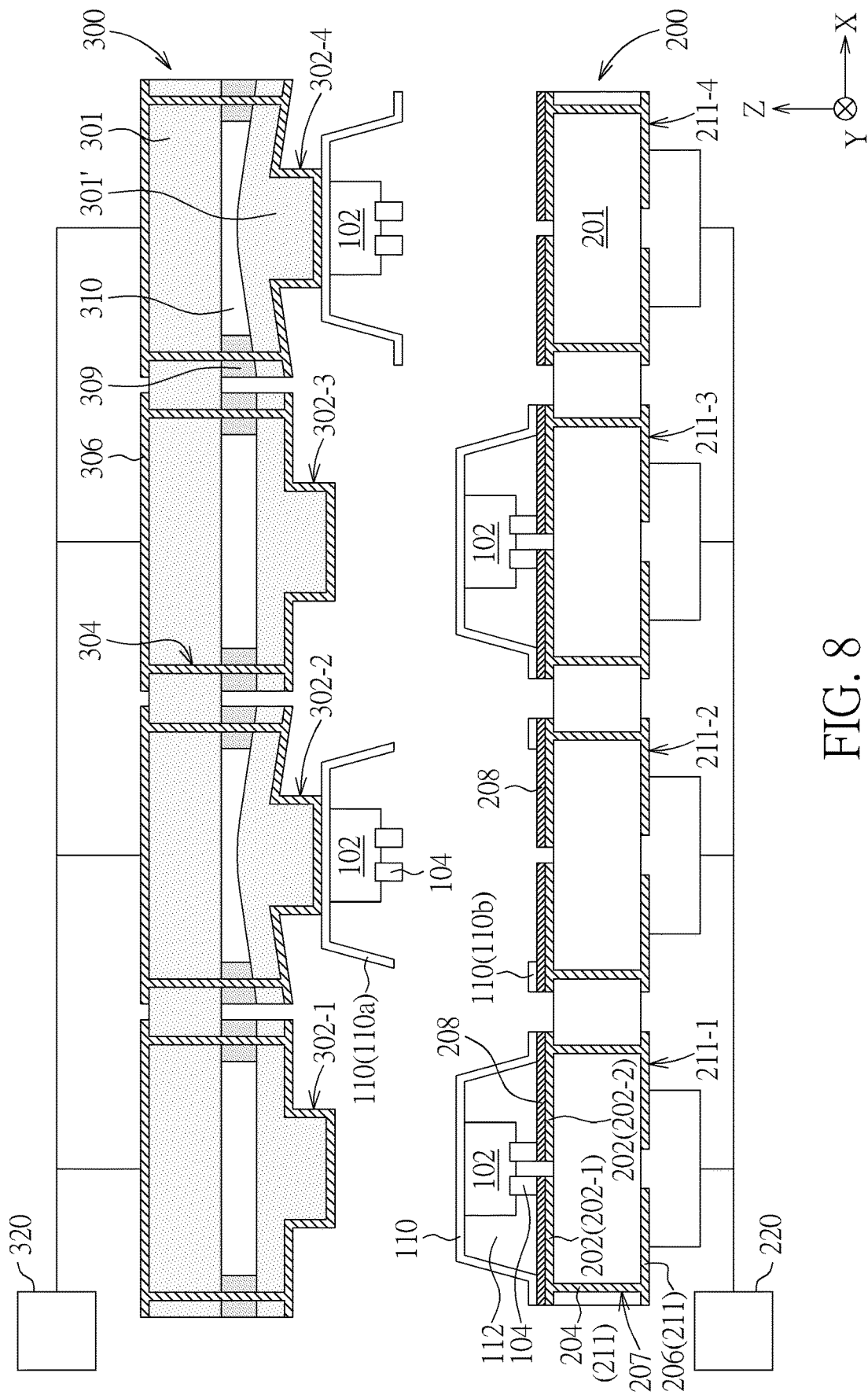
FIG. 8 is a schematic cross-sectional view showing a conductive carrier and the step of picking up the electronic elements from the conductive carrier according to another embodiment of the disclosure.

Please refer to FIG. 8, which is a schematic cross-sectional view showing a conductive carrier and the step of picking up the electronic elements from the conductive carrier according to another embodiment of the disclosure. The difference between the embodiment shown in FIG. 8 and the embodiment shown in FIG. 1 to FIG. 6 is that the conductive pads 202 of the sub-conductive structures corresponding to one of the electronic elements 102 are divided into at least a sub-conductive pad 202-1 and a sub-conductive pad 202-2 that are respectively corresponding to one of the electrodes 104 of the electronic elements 102. Besides, a pad layer 208 may be disposed on each of the sub-conductive pad 202-1 and the sub-conductive pad 202-2 of the conductive pads 202 to electrically isolate the electronic elements 102 from the sub-conductive pad 202-1 and the sub-conductive pad 202-2, and also electrically isolates the electronic elements 102 from the conductive carrier 200. In some embodiments, the pad layer 208 may be made of a dielectric material such as silicon oxide, silicon nitride, silicon oxynitride, silicon carbide, silicon carbonitride, or a high-k dielectric material, but is not limited thereto. In some embodiments, the pad layer 208 and the insulating layer 110 may include a same dielectric material. Furthermore, in the embodiment shown in FIG. 8, the conductive carrier 200 may be electrically connected to a control circuit 220. The control circuit 220 may selectively provide the same or different voltages to each of the sub-conductive structures.

Specifically, in the embodiment shown in FIG. 8, before performing the step 28 to pick up the electronic elements 102, the control circuit 220 may set the conductive carrier 200 to have a first voltage. For example, the control circuit 220 may supply an adsorption voltage to each of the conductive pads 202. The electric field generated by the adsorption voltage may polarize the pad layer 208. The induced charges opposite to the adsorption voltage may accumulate on the electrodes 104 of the electronic elements 102. An electrostatic force of attraction may be generated between the conductive pads 202 and the corresponding electronic elements 102 to help holding the electronic elements 102 on the conductive carrier 200, so that the unexpected displacements of the electronic elements 102 may not be reduced.

Please continue to refer to FIG. 8. During the step 28 of picking up the electronic elements 102, the control circuit 220 may set the conductive carrier 200 to have a voltage at least at the time when the transfer heads 302-1, 302-2, 302-3 and 302-4 contact the insulating layer 110. For example, the control circuit 220 may provide a reference voltage (for example, an AC voltage or a DC voltage) to the sub-conductive pads 202-1 and 202-2 of the sub-conductive structures to eliminate the electrostatic force of attraction and the residual induced charges between the electronic elements 102 and the sub-conductive pads 202-1, 202-2. Furthermore, the control circuit 220 may maintain the conductive carrier 200 at a potential different from the potential of the transfer device 300 during the step 28. For example, the control circuit 220 may maintain the conductive carrier 200 at a potential lower than the potential of the transfer device 300 to facilitate the transfer heads 302-2 and 302-4 picking up the electronic elements 102 from the conductive carrier 200. In this way, the selected electronic elements 102 may be selectively released from the conductive carrier 200 by the control circuit 220. According to some embodiments of the present disclosure, the reference voltage and the first voltage are different. According to some embodiments, the reference voltage may be smaller than the first voltage.

Please continue to refer to FIG. 8. After the step 28 of picking up the electronic elements 102, the control circuit 220 may set the conductive carrier 200 to have a second voltage. For example, the control circuit 220 may set the conductive carrier 200 to have another adsorption voltage to make the non-picked electronic elements 102 be adsorbed on the conductive carrier 200. The second voltage may be equal to the first voltage, but is not limited thereto. The first voltage and the second voltage in the embodiment shown in FIG. 8 are different from the reference voltage mentioned in the embodiment shown in FIG. 1 and FIG. 6. In some embodiments, the first voltage and the second voltage may be larger than the reference voltage.

The present disclosure may achieve a selective pick-up of the electronic elements 102 by adjusting the voltages supplied to the transfer heads 302-1, 302-2, 302-3 and 302-4 by the control circuits 320 and/or by adjusting the voltages supplied to the sub-conductive structures 211-1, 211-2, 211-3 and 211-4 by the control circuits 220. Please refer to the example shown in FIG. 8. At least at the same time or before the control circuits 320 supplies the pull-in voltage, or at least at the time the transfer heads 302-2 and 302-4 pick up the electronic elements 102, the control circuit 200 may selectively supply the reference voltage to the sub-conductive pads 202-1 and 202-2 of the sub-conductive structures 211-2 and 211-4 when no reference voltage is supplied to the sub-conductive pads 202-1 and 202-2 of the sub-conductive structures 211-1 and 211-3.

Figure 9:
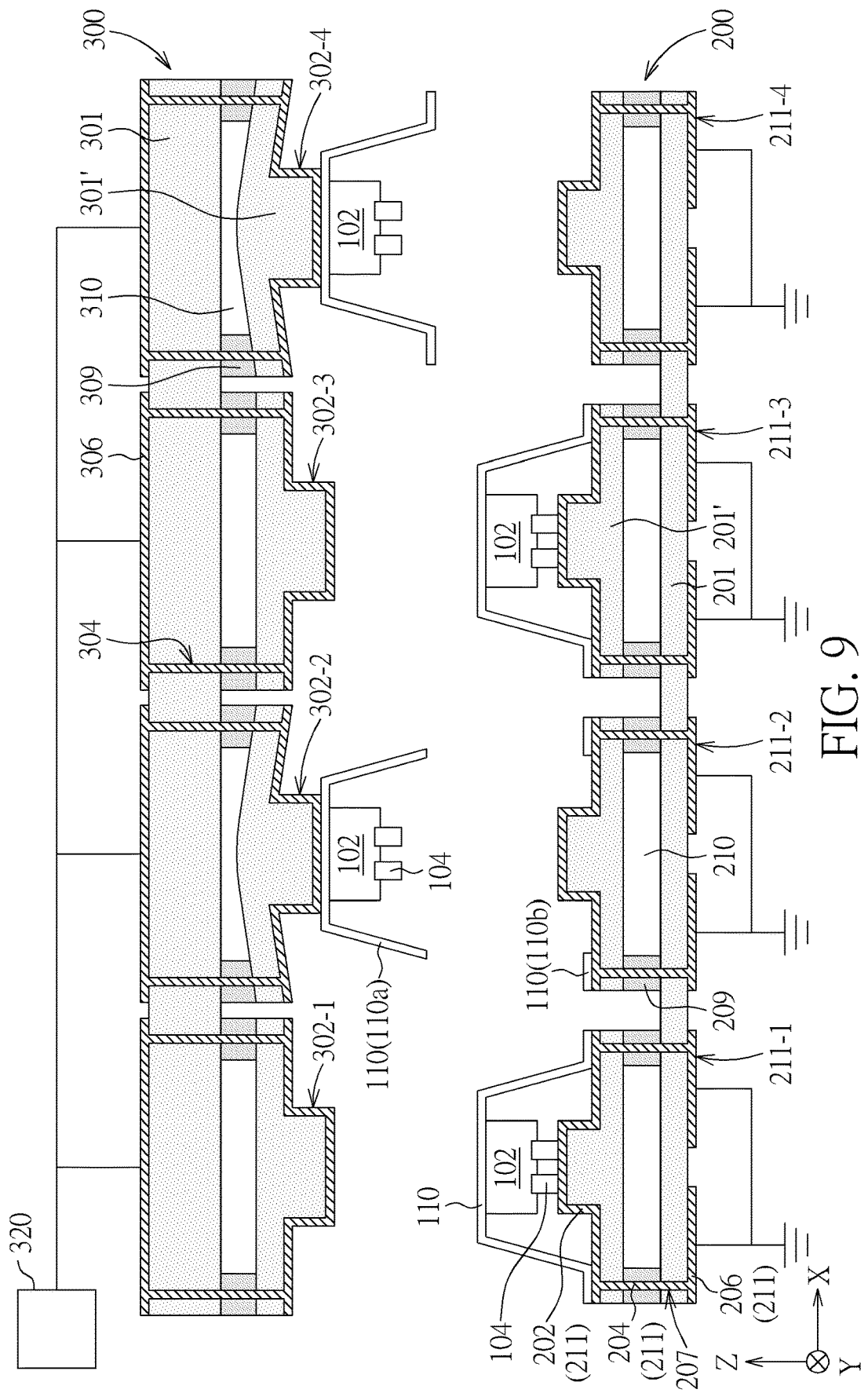
FIG. 9 is a schematic cross-sectional view showing a conductive carrier and the step of picking up the electronic elements from the conductive carrier according to still another embodiment of the disclosure.

Please refer to FIG. 9, which is a schematic cross-sectional view showing a conductive carrier and the step of picking up the electronic elements from the conductive carrier according to still another embodiment of the disclosure. The difference between the embodiment shown in FIG. 9 and the embodiment shown in FIG. 1 to FIG. 6 is that the conductive carrier 200 shown in FIG. 9 may include a mechanical design having elastic property. For example, the conductive carrier 200 may include two base layers, the base layer 201 and the base layer 201', and an intermediate insulating layer 209 disposed between the base layers 201 and 201'. A gap 210 may be formed between the base layer 201, the base layer 201' and the intermediate insulating layer 209. The gap 210 may be formed by removing a portion of the intermediate insulating layer 209, but is not limited thereto. The materials of the base layer 201, the base layer 201' and the intermediate insulating layer 209 may include semiconductor materials such as silicon or silicon oxide, but are not limited thereto. The intermediate insulating layer 209 may be made of an elastic material, or the thickness of the intermediate insulating layer 209 may be adjusted to impart an elastic property to the conductive carrier 200, but it is not limited thereto. In some embodiments, the base layers 201, 201' may include silicon.

Figure 10:
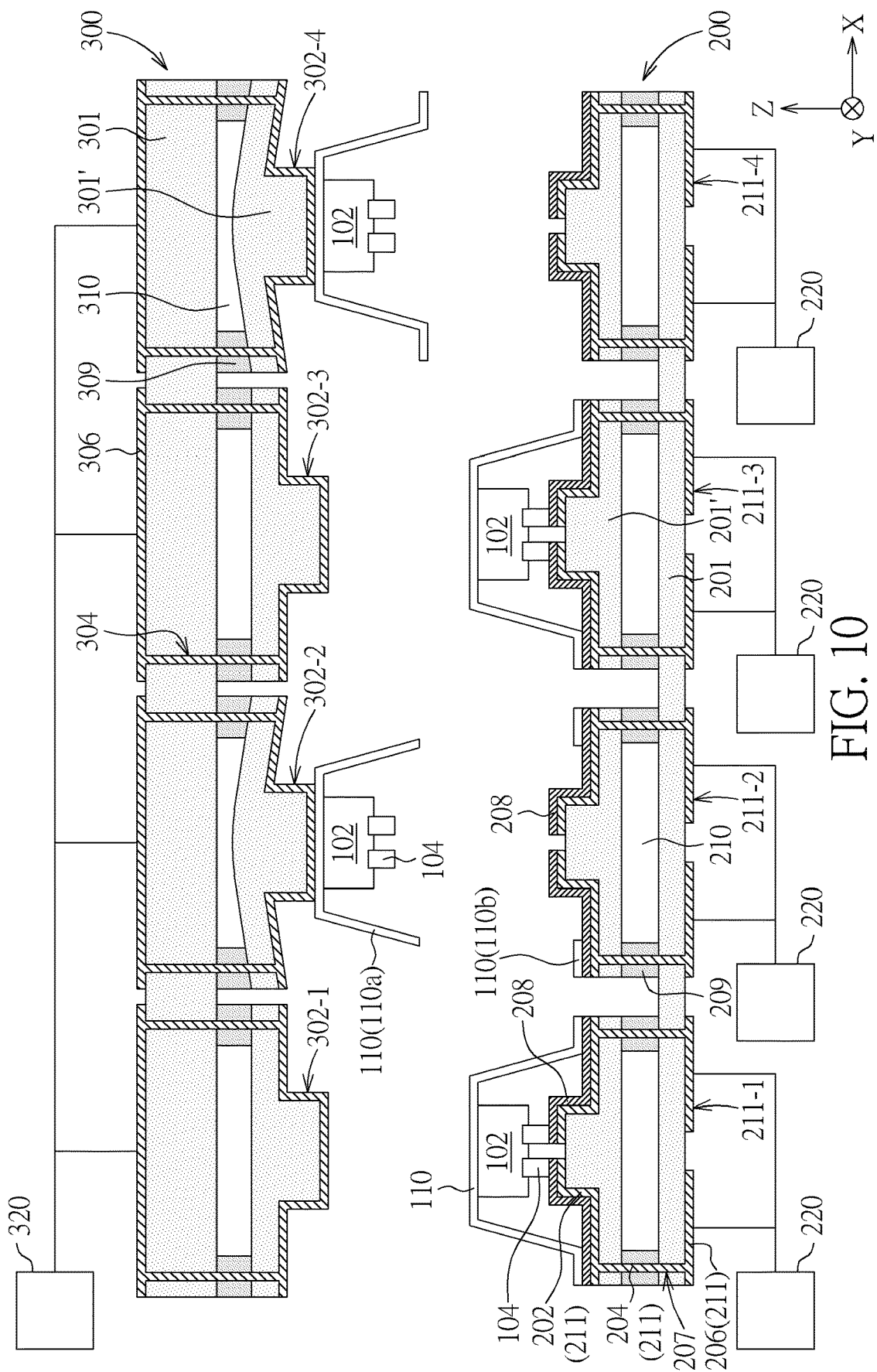
FIG. 10 is a schematic cross-sectional view showing a conductive carrier and the step of picking up the electronic elements from the conductive carrier according to yet another embodiment of the disclosure.

Please refer to FIG. 10, which is a schematic cross-sectional view showing a conductive carrier and the step of picking up the electronic elements from the conductive carrier according to yet another embodiment of the disclosure. The difference between the embodiment shown in FIG. 10 and the embodiment shown in FIG. 1 to FIG. 6 is that the sub-conductive structures of the conductive carrier 200 may be respectively electrically connected to different control circuits 220. The conductive carrier 200 shown in FIG. 10 may also include a mechanical design having elastic property as shown in FIG. 9. Furthermore, similar to the embodiment shown in FIG. 8, the embodiment shown in FIG. 10 also has a pad layer 208 formed on the sub-conductive pads 202-1, 202-2 to electrically isolate the electronic elements 102 from the sub-conductive pads 202-1, 202-2 and from the conductive carrier 200. The electronic elements 102 may be adsorbed on the conductive carrier 200 by the mechanism described above.

The conductive carrier 200 and the transfer device 300 shown in FIG. 9 and FIG. 10 are designed to have a mechanical design having elastic property. The elastic property of the conductive carrier 200 and the transfer device 300 may allow appropriate vertical elastic displacements of the conductive pads 202 and/or the electronic elements 102 disposed on the conductive pads 202 for compensating the warpage of the conductive carrier 200 and/or the transfer device 300, and/or compensate the topography caused by the thickness variations of the electronic elements 102. In this way, the transfer heads 302-1, 302-2, 302-3 and 302-4 may contact the insulating layer 110 more intimately and the accuracy of the transfer heads 302-1, 302-2, 302-3 and 302-4 to pick up the selected electronic elements 102 may be improved.

In summary, one aspect of the present disclosure is that the method of manufacturing an electronic device includes utilizing the insulating layer 110 to hold the electronic elements 102 on the conductive carrier 200 and prevents unexpected displacements of the electronic elements 102 during the transferring process. The present disclosure using the insulating layer 110 instead of the sacrificial layer 108 to hold the electronic elements 102 may reduce the risk of failing to pick up the electronic elements 102 due to the adhesive force of the sacrificial layer 108 being greater than the electrostatic force of attraction between the transfer heads 302-2 and 302-4, for example, and the electronic elements 102. Another aspect of the present disclosure is that the method of manufacturing an electronic device includes selectively setting the conductive carrier 200 to have a reference voltage to remove the residual charges accumulated in the electronic elements 102. In this way, the transferring efficiency and yield may be improved. Furthermore, the method of manufacturing an electronic device may have an insulating layer 208 disposed between the electronic elements 102 and the conductive carrier 200. Before picking up the electronic elements 102, the control circuit 220 may supply an adsorption voltage to the conductive carrier 200 to generate an electrostatic force of attraction to the electronic elements 102 through the insulating layer 208 to hold the electronic elements 102 on the conductive carrier 200. During picking up the electronic elements 102, the control circuit 220 may supply a reference voltage to the conductive carrier 200 to release the electronic elements 102. The method of manufacturing an electronic device provided by the present invention may increase the efficiency and accuracy of transferring the electronic elements to the target substrate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method of manufacturing an electronic device, comprising:
   providing a conductive carrier with at least one conductive pad and at least one electronic element disposed on the at least one conductive pad;
   forming an insulating layer on the conductive carrier and covering the electronic element, wherein the insulating layer directly contacts a top surface of the at least one electronic element and is spaced from a sidewall of the at least one electronic element by a space;
   contacting the insulating layer on the top surface of the electronic element with a transfer head;
   picking up the at least one electronic element with the transfer head;
   setting the at least one conductive pad to have a ground voltage at least during in the step of picking up the at least one electronic element; and
   transferring the at least one electronic element to a target substrate.

2. The method according to claim 1, wherein the at least one electronic element is electrically connected to the conductive carrier.

3. The method according to claim 1, wherein the at least one electronic element is electrically isolated from the conductive carrier.

4. The method according to claim 3, further comprising setting the at least one conductive pad to have a first voltage before the step of picking up the at least one electronic element, wherein the first voltage is different from the ground voltage.

5. The method according to claim 3, further comprising setting the at least one conductive pad to have a second voltage after the step of picking up the at least one electronic element, wherein the second voltage is different from the ground voltage.

6. The method according to claim 1, wherein the at least one electronic element is picked up through an electrostatic force.

7. The method according to claim 1, wherein the conductive carrier comprises two base layers and an intermediate insulating layer disposed between the two base layers.

8. The method according to claim 7, wherein a portion of the intermediate insulating layer is removed.

9. A method of manufacturing an electronic device, comprising:
   providing a conductive carrier with at least one conductive pad and at least one electronic element disposed on the at least one conductive pad;
   forming an insulating layer on the conductive carrier and covering the electronic element, wherein the insulating layer directly contacts a top surface of the at least one electronic element and is spaced from a sidewall of the at least one electronic element by a space;
   contacting the insulating layer on the top surface of the electronic element with a transfer head;
   picking up the at least one electronic element with the transfer head and setting the at least one conductive pad to have a reference voltage; and
   transferring the at least one electronic element to a target substrate.

10. The method according to claim 9, further comprising:
    forming a sacrificial layer covering the at least one electronic element;
    removing a portion of the sacrificial layer to make the at least one electronic element be surrounded by the sacrificial layer beside the at least one electronic element; and
    forming an insulating layer covering a top surface of the at least one electronic element and the sacrificial layer beside the at least one electronic element.

11. The method according to claim 10, in the step of transferring the at least one electronic element to a target substrate, further comprising:
    transferring the at least one electronic element from the transfer head to the target substrate.

12. The method according to claim 11, wherein an electrostatic force is generated between the transfer head and the at least one electronic element by polarizing the insulating layer disposed therebetween at the step of picking up the at least one electronic element.

13. The method according to claim 11, further comprising setting the transfer head to have a pull-in voltage at least in the step of picking up the at least one electronic element.

14. The method according to claim 13, wherein the pull-in voltage is a positive voltage.

15. The method according to claim 13, wherein the pull-in voltage is a negative voltage.

16. The method according to claim 11, wherein the transfer head directly contacts the insulating layer on the top surface of the at least one electronic element.

17. The method according to claim 9, wherein the reference voltage is an AC voltage.

18. The method according to claim 17, wherein the reference voltage is a ground voltage.

19. The method according to claim 9, wherein the reference voltage is a DC voltage.

20. The method according to claim 19, wherein the reference voltage is 0 volts.

* * * * *